US010680626B2

(12) United States Patent
Hsiao et al.

(10) Patent No.: US 10,680,626 B2
(45) Date of Patent: Jun. 9, 2020

(54) METHOD AND ASSOCIATED SIGNAL SYSTEM IMPROVING MITIGATION OF INJECTION-PULLING EFFECT

(71) Applicant: MEDIATEK Inc., Hsinchu (TW)

(72) Inventors: Chieh-Hsun Hsiao, Hsinchu (TW); Shih-Chi Shen, Hsinchu (TW); Chi-Hsueh Wang, Hsinchu (TW); Hsin-Hung Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 4 days.

(21) Appl. No.: 16/120,513

(22) Filed: Sep. 4, 2018

(65) Prior Publication Data

US 2019/0131982 A1    May 2, 2019

Related U.S. Application Data

(60) Provisional application No. 62/577,748, filed on Oct. 27, 2017.

(51) Int. Cl.
| | |
|---|---|
| *H03L 7/099* | (2006.01) |
| *G04F 10/00* | (2006.01) |
| *H02M 3/07* | (2006.01) |
| *H03L 7/093* | (2006.01) |

(52) U.S. Cl.
CPC .......... *H03L 7/0992* (2013.01); *G04F 10/005* (2013.01); *H02M 3/07* (2013.01); *H03L 7/093* (2013.01)

(58) Field of Classification Search
CPC .................................................... H03L 7/0992
See application file for complete search history.

(56) References Cited

U.S. PATENT DOCUMENTS

| | | | | |
|---|---|---|---|---|
| 7,809,338 | B2 * | 10/2010 | Tsfati | H03B 19/00 327/156 |
| 8,044,734 | B2 | 10/2011 | Lane | |
| 8,670,322 | B2 | 3/2014 | Yehezkely et al. | |
| 9,172,570 | B1 | 10/2015 | Li Puma | |
| 2012/0025918 | A1 * | 2/2012 | Wang | H03L 7/0996 331/25 |
| 2017/0353189 | A1 * | 12/2017 | Chen | H03L 7/06 |

OTHER PUBLICATIONS

TIPO Office Action dated Jan. 25, 2019 in Taiwan application (No. 107132458).

(Continued)

*Primary Examiner* — Joseph Chang
(74) *Attorney, Agent, or Firm* — McClure, Qualey & Rodack, LLP

(57) ABSTRACT

The invention provides method and associated signal system improving mitigation of injection-pulling effect for an oscillator which generates an output clock under control of a control signal. The method may include: by a loop filter, filtering a deviation signal to form a filtered signal; by a SIL (self-injection locked) controller, forming an auxiliary signal which tracks the deviation signal or a phase difference between a reference clock and an output signal resulting from the output clock; and, forming the control signal by summing the filtered signal and the auxiliary signal.

19 Claims, 8 Drawing Sheets

(56) References Cited

OTHER PUBLICATIONS

Behzad Razavi: "A Study of Injection Locking and Pulling in Oscillators"; IEEE Journal of Solid-State Circuits, vol. 39, No. 9, Sep. 2004; pp. 1415-1424.
Bashir, et al.: "A Novel Approach for Mitigation of RF Oscillator Pulling in a Polar Transmitter"; IEEE Journal of Solid-State Circuits, vol. 46, No. 2, Feb. 2011; pp. 403-415.
Hsiao, et al.: "Analysis and Improvement of Direct-Conversion Transmitter Pulling Effects in Constant Envelope Modulation Systems"; IEEE Transactions on Microwave Theory and Techniques, vol. 58, No. 12, Dec. 2010; pp. 4137-4146.
Mirzaei, et al.: "Pulling Mitigation in Wireless Transmitters"; IEEE Journal of Solid-State Circuits, vol. 49, No. 9, Sep. 2014; pp. 1958-1970.

\* cited by examiner

METHOD AND ASSOCIATED SIGNAL SYSTEM IMPROVING MITIGATION OF INJECTION-PULLING EFFECT

This application claims the benefit of U.S. provisional application Ser. No. 62/577,748, filed Oct. 27, 2017, the subject matter of which is incorporated herein by reference.

FIELD OF THE INVENTION

The present invention relates to method and associated signal system improving mitigation of injection-pulling effect, and more particularly, to method and associated signal system improving mitigation of injection-pulling effect for an oscillator.

BACKGROUND OF THE INVENTION

Signal system including an oscillator for generating clock and/or oscillation signal is essential for modern electronics. For example, an electronic demanding wireless communication capability needs a signal system with an oscillator to implement an RF transmitter, receiver and/or transceiver.

Please refer to FIG. 1 illustrating a conventional signal system 100, such as an RF transmitter of a direct-conversion architecture. The system 100 includes a phase detection circuitry 110, a loop filter 140, an oscillator 160, a quadrature modulator 165 and a power amplifier 174. The oscillator 160 oscillates under control of a control signal sf1 to generate an RF clock CKv1. The quadrature modulator modulates baseband data signals I_data and Q_data by the clock CKv1 to form an RF signal ss1, and the amplifier 174 amplifies the signal ss1 to an amplified RF signal so1. To generate the signal sf1 which controls the oscillator 160, the phase detection circuitry 110 detects a phase difference between a reference clock CKref and the clock CKv1 to form a signal se1, and the loop filter 140 filters the signal se1 to the signal sf1. As shown in FIG. 1, the loop filter 140 is a low-pass filter with a frequency response of a bandwidth f0.

Noises affecting the system 100 include reference noise related to the phase detection circuitry 110, oscillator noise determined by its intrinsic jitter performance and resonator design, and injection noise related to the equivalent phase disturbance induced by injection-pulling effect. For example, nonlinearity of the amplifier 174 will cause undesired harmonics, and the harmonics will cause a frequency of the clock CKv1 to be pulled away from an expected frequency, and/or cause a spectrum of the clock CKv1 to deviate from an expected spectrum. Injection-pulling effect is critical for direct-conversion signal system, because frequency of the signals ss1 and so1 are substantially the same as (or very closed to) frequency of the clock CKv1. The bandwidth f0 of the loop filter 140 is usually designed for a compromise between the reference noise and the oscillator noise, but such bandwidth f0 will suffer from considerable injection noise.

There are several kinds of prior arts to mitigate the injection-pulling effect. One kind of prior arts attempts to mitigate the injection-pulling effect by improving isolation between the amplifier 174 and the oscillator 160, but suffers from high hardware cost and layout complexity. Another kind of prior arts attempts to mitigate the injection-pulling effect by expanding the bandwidth f0 of the loop filter 140, but suffers from adverse impact to original loop design strategy, which means designers cannot just focus on how to achieve optimal suppression according to reference noise and oscillator noise. Yet another kind of prior arts attempts to mitigate the injection-pulling effect by applying adaptive interference cancellation, but it must suffer from complicated digital calibration and stringent compensation precision demands.

SUMMARY OF THE INVENTION

An objective of the invention is providing a method (e.g., FIG. 7) improving mitigation of injection-pulling effect for an oscillator (e.g., 260, 360, 460 or 560 in FIG. 2, 3, 4 or 5) which may generate an output dock (e.g., CKv2, CKv3, CKv4 or CKv5 in FIG. 2, 3, 4 or 5) under control of a control signal (e.g., sc2, sc3, sc4 or sc5 in FIG. 2, 3, 4 or 5). The method may include: by a loop filter (e.g., 240, 340, 440 or 540 in FIG. 2, 3, 4 or 5), filtering a deviation signal (e.g., se2, se3, se4 or se5 in FIG. 2, 3, 4 or 5) to form a filtered signal (e.g., sf2, sf3, sf4 or sf5 in FIG. 2, 3, 4 or 5); by a SIL (self-injection locked) controller (e.g., 250, 350, 450 or 550 in FIG. 2, 3, 4 or 5), forming an auxiliary signal (e.g., sa2, sa3, sa4 or sa5 in FIG. 2, 3, 4 or 5) which tracks instantaneous varying of the deviation signal (e.g., se2 or se4 in FIG. 2 or 4), or a phase difference (e.g., sdd3 or sdd5 in FIG. 3 or 5) between a reference dock (e.g., CKref in FIG. 2, 3, 4 or 5) and an output signal (such as a most suspected interference signal, e.g., so3 or so5 in FIG. 3 or 5) resulting from the output clock; and, forming the control signal (e.g., sc3 or sc5 in FIG. 3 or 5) by summing the filtered signal (e.g., sf3 or sf5 in FIG. 3 or 5) and the auxiliary signal (e.g., sa3 or sa5 in FIG. 3 or 5).

In an embodiment (e.g., FIG. 2 or 3), the method may further include: by a measuring circuit (e.g., 220 or 320 in FIG. 2 or 3), measuring a phase difference between the reference clock and the output clock to form a distinction signal (e.g., sd2 or sd3 in FIG. 2 or 3); by an accumulator (e.g., 210 or 310 in FIG. 2 or 3), accumulating a frequency command word (e.g., FCW in FIG. 2 or 3) at each cycle of the reference clock to form a reference signal (e.g., sr2 or sr3 in FIG. 2 or 3); and, forming the deviation signal by a difference between the reference signal and the distinction signal.

In an embodiment (e.g., FIG. 3), the method may further include: by a quadrature modulator (e.g., 365 in FIG. 3), performing a quadrature modulation by the output clock (e.g., CKv3 in FIG. 3) to form a modulated signal (e.g., sm3 in FIG. 3); and, by a main amplifier (e.g., 370 in FIG. 3), amplifying the modulated signal to the required power level and form the resultant output signal (e.g., so3 in FIG. 3).

In an embodiment (e.g., FIG. 4 or 5), the method may further include: by a measuring circuit (e.g., 420 or 520 in FIG. 4 or 5), measuring a phase difference between the reference clock and the output clock to form a distinction signal (e.g., sd4 or sd5 in FIG. 4 or 5); summing a frequency control word (e.g., FCW in FIG. 4 or 5) and a first source signal (e.g., sPM in FIG. 4 or 5) to form a summed word (e.g., sw4 or sw5 in FIG. 4 or 5); by an accumulator (e.g., 410 or 510 in FIG. 4 or 5), accumulating the summed word at each cycle of the reference clock to form a reference signal (e.g., sr4 or sr5 in FIG. 4 or 5); and, forming the deviation signal by a difference between the reference signal and the distinction signal, wherein forming the control signal is performed by summing the filtered signal and the auxiliary signal along with the first source signal.

In an embodiment (e.g., FIG. 4 or 5), the method may further include: by a frequency divider (e.g., 463 or 563 in FIG. 4 or 5), performing frequency dividing on the output clock to form a local oscillation signal (e.g., LO4 or LO5 in FIG. 4 or 5); mixing the local oscillation signal and a second source signal (e.g., sAM in FIG. 4 or 5) to form a mixed signal (e.g., sm4 or sm5 in FIG. 4 or 5); and, by a main amplifier (e.g., 470 or 570 in FIG. 4 or 5), amplifying the mixed signal to form the output signal.

In an embodiment (e.g., FIG. 6), forming the auxiliary signal (e.g., sa6 in FIG. 6) may include: by the SIL controller (e.g., 650 in FIG. 6), converting the deviation signal or said phase difference between the reference clock and the output signal to the required auxiliary signal (e.g., sa6 in FIG. 6) to correct the oscillator distortion due to injection-pulling effect; and, by a data converter (e.g., 652 in FIG. 6) and an internal amplifier (e.g., 654 in FIG. 6) to achieve optimal self-injection condition.

An objective of the invention is providing a signal system (e.g., 200, 300, 400 or 500 in FIG. 2, 3, 4 or 5) improving mitigation of injection-pulling effect. The system may include an oscillator (e.g., 260, 360, 460 or 560 in FIG. 2, 3, 4 or 5), a loop filter (e.g., 240, 340, 440 or 540 in FIG. 2, 3, 4 or 5), a SIL controller (e.g., 250, 350, 450 or 550 in FIG. 2, 3, 4 or 5) and a sum block (e.g., 255, 355, 455 or 555 in FIG. 2, 3, 4, 5). The oscillator may generate an output clock (e.g., CKv2, CKv3, CKv4 or CKv5 in FIG. 2, 3, 4 or 5) under control of a control signal (e.g., sc2, sc3, sc4 or sc5 in FIG. 2, 3, 4 or 5). The loop filter may filter a deviation signal (e.g., se2, se3, se4 or se5 in FIG. 2, 3, 4 or 5) to form a filtered signal (e.g., sf2, sf3, sf4 or sf5 in FIG. 2, 3, 4 or 5). The SIL controller may form an auxiliary signal (e.g., sa2, sa3, sa4 or sa5 in FIG. 2, 3, 4 or 5) which tracks instantaneous varying of the deviation signal or a phase difference between a reference dock (e.g., CKref in FIG. 2, 3, 4 or 5) and an output signal (e.g., so3 or so5 in FIG. 3 or 5) resulting from the output dock. The sum block may be coupled between the loop filter, the SIL controller and the oscillator, for forming the control signal by summing the filtered signal and the auxiliary signal.

In an embodiment (e.g., FIG. 2 or 3), the signal system may further include a measuring circuit (e.g., 220 or 320 in FIG. 2 or 3), an accumulator (e.g., 210 or 310 in FIG. 2 or 3) and a second sum block (e.g., 230 or 330 in FIG. 2 or 3). The measuring circuit may be coupled to the oscillator, for measuring a phase difference between the reference clock and the output clock to form a distinction signal (e.g., sd2 or sd3 in FIG. 2 or 3). The accumulator may accumulate a frequency command word (e.g., FCW in FIG. 2 or 3) at each cycle of the reference clock to form a reference signal (e.g., sr2 or sr3 in FIG. 2 or 3). The second sum block may be coupled between the measuring circuit, the accumulator and the loop filter, for forming the deviation signal by a difference between the reference signal and the distinction signal. In an embodiment (e.g., FIG. 2 or 3), the measuring circuit may be a TDC (e.g., time-to-digital converter). In an embodiment, the oscillator may be a digitally controlled oscillator.

In an embodiment (e.g., FIG. 3), the signal system may further include a quadrature modulator (e.g., 365 in FIG. 3) and a main amplifier (e.g., 370 in FIG. 3). The quadrature modulator may be coupled to the oscillator, for performing a quadrature modulation by the output clock to form a modulated signal (e.g., sm3 in FIG. 3). The main amplifier may be coupled to the quadrature modulator, for amplifying the modulated signal to form the output signal. In an embodiment (e.g., FIG. 3), the signal system may further include a second measuring circuit (e.g., 380 in FIG. 3) coupled between the main amplifier and the SIL controller, for measuring said phase difference between the reference clock and the output signal. In an embodiment, FIG. 3), the main amplifier may include a power amplifier (e.g., 374 in FIG. 3) and a programmable-gain amplifier (e.g., 372 in FIG. 3).

In an embodiment (e.g., FIG. 3), the signal system may further include a second measuring circuit (e.g., 380 in FIG. 3) coupled between the main amplifier and the and the SIL controller, for measuring said phase difference between the reference clock and the output signal.

In an embodiment (e.g., FIG. 4 or 5), the signal system may further include a measuring circuit (e.g., 420 or 520 in FIG. 4 or 5), an accumulator (e.g., 410 or 510 in FIG. 4 or 5), a second sum block (e.g., 430 or 530 in FIG. 4 or 5) and a third sum block (e.g., 403 or 503 in FIG. 4 or 5). The measuring circuit may be coupled to the oscillator, for measuring a phase difference between the reference clock and the output dock to form a distinction signal (e.g., sd4 or sd5 in FIG. 4 or 5). The accumulator may accumulate a summed word (e.g., sw4 or sw5 in FIG. 4 or 5) at each cycle of the reference clock to form a reference signal (e.g., sr4 or sr5 in FIG. 4 or 5). The second sum block may be coupled between the measuring circuit, the accumulator and the loop filter, for forming the deviation signal by a difference between the reference signal and the distinction signal. The third sum block may be coupled to the accumulator, for summing a frequency control word (e.g., FCW in FIG. 4 or 5) and a first source signal (e.g., sPM in FIG. 4 or 5) to form the summed word. The sum block (e.g., 455 or 555 in FIG. 4 or 5) may be arranged to form the control signal by summing the filtered signal and the auxiliary signal along with the first source signal.

In an embodiment (e.g., FIG. 4 or 5), the signal system may further include a frequency divider (e.g., 463 or 563 in FIG. 4 or 5), a mixer (e.g., 465 or 565 in FIG. 4 or 5) and a main amplifier (e.g., 470 or 570 in FIG. 4 or 5). The frequency divider may be coupled to the oscillator, for performing frequency dividing on the output dock to form a local oscillation signal (e.g., LO4 or LO5 in FIG. 4 or 5). The mixer may be coupled to the frequency divider, for mixing the local oscillation signal and a second source signal (e.g., sAM in FIG. 4 or 5) to form a mixed signal (e.g., sm4 or sm5 in FIG. 4 or 5). The main amplifier may be coupled to the mixer, for amplifying the mixed signal to form the output signal.

In an embodiment (e.g., FIG. 5), the signal system may further include a second measuring circuit (e.g., 580 in FIG. 5) coupled between the main amplifier and the and the SIL controller, for measuring said phase difference between the reference clock and the output signal.

In an embodiment (e.g., FIG. 6), the SIL controller (e.g., 650 in FIG. 6) may include a data converter (e.g., 652 in FIG. 6) and an internal amplifier (e.g., 654 in FIG. 6). The SIL controller (e.g., 650 in FIG. 6) may convert the deviation signal or said phase difference between the reference clock and the output signal to the required auxiliary signal (e.g., sa6 in FIG. 6) to correct the oscillator distortion due to injection-pulling effect; and, by the data converter (e.g., 652 in FIG. 6) and the internal amplifier (e.g., 654 in FIG. 6) to achieve optimal self-injection condition.

An objective of the invention is providing a signal system (e.g., 900 in FIG. 8) improving mitigation of injection-pulling effect. The signal system may include an oscillator (e.g., 960), a loop filter (e.g., 940), a SIL controller (e.g., 950) and a sum block (e.g., 955). The oscillator may generate an output clock (e.g., CKv9) under control of a control signal (e.g., sc9). The loop filter may filter a deviation signal (e.g., se9) to form a filtered signal (e.g., sf9). The SIL controller may form an auxiliary signal (e.g., sa9) by performing frequency discriminating on the output clock. The sum block (e.g., 955) may be coupled between the oscillator, the SIL controller and the loop filter, for forming the control signal by summing the filtered signal and the auxiliary signal.

In an embodiment (e.g., FIG. 8), the SIL controller may include a delay circuit (e.g., 952), an internal sum block (e.g., 953), an internal amplifier (e.g., 954) and a data converter (e.g., 956). The delay circuit may be coupled to the oscillator, for forming a delayed clock (e.g., sy9) by delaying the output clock. The internal sum block may be coupled to the delay circuit, for forming a distinction signal (e.g., sd9) by a difference between the output clock and the delayed clock. The internal amplifier may be coupled to the internal sum block, for amplifying the distinction signal to form an amplified distinction signal (e.g., sg9). The data converter (e.g., 956) may convert the amplified distinction signal to the auxiliary signal (e.g., sa9) to correct the oscillator distortion due to injection-pulling effect.

In an embodiment (e.g., FIG. 8), the signal system may further include a frequency divider (e.g., 994), a phase detector (e.g., 920) and a charge pump (e.g., 930). The frequency divider may be coupled to the oscillator, for performing frequency dividing on the output clock to form a divided clock (e.g., CKd9). The phase detector may be coupled to the frequency divider, for measuring a phase difference between a reference clock (e.g., CKref) and the divided clock to form a preliminary deviation signal (e.g., sp9). The charge pump may be coupled between the phase detector and the loop filter, for converting the preliminary deviation signal to the deviation signal by current to voltage conversion.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
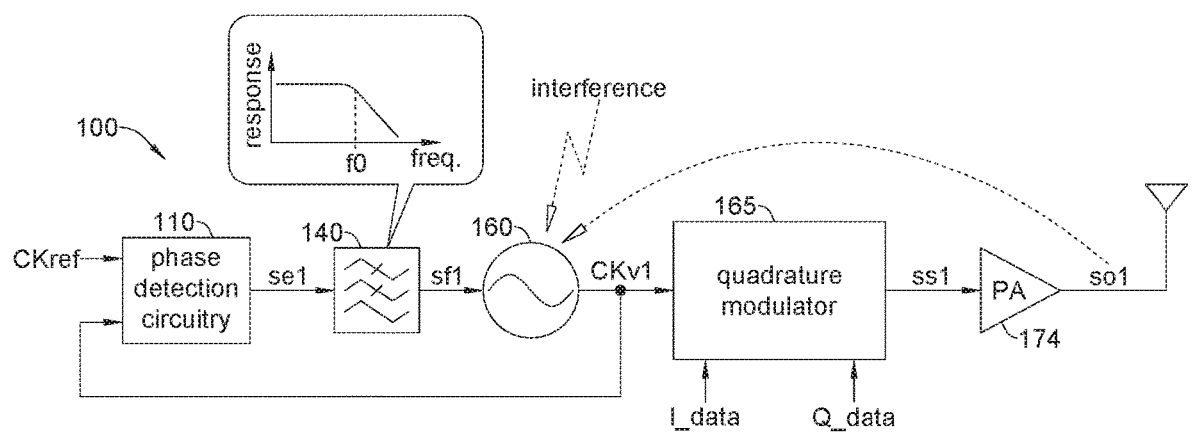
FIG. 1 (prior art) illustrates a conventional signal system.
Figure 2:
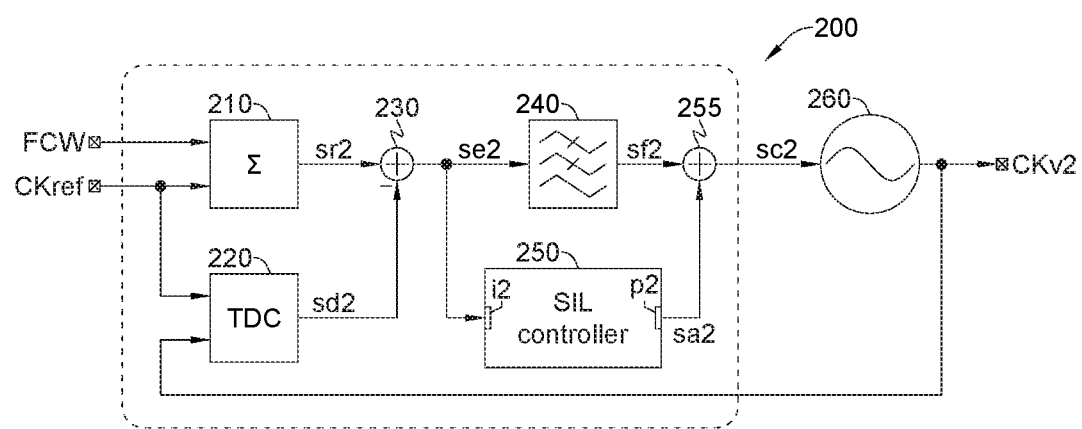
FIGS. 2 to 5 illustrate signal systems according to embodiments of the invention.

Please refer to FIG. 2 illustrating a signal system 200 according to an embodiment of the invention. The system 200 may include an accumulator 210, a measuring circuit 220, a sum block 230, a loop filter 240 and an oscillator 260; to improve mitigation of injection-pulling effect, the system 200 may further include a SIL controller 250 along with another sum block 255. The oscillator 260 may oscillate under control of a control signal sc2 to generate an output clock CKv2, such that a frequency of the clock CKv2 may vary as the control signal sc2 varies. The accumulator 210 may be coupled to a frequency command word FCW and a reference clock CKref, for accumulating the frequency command word FCW at each cycle of the clock CKref to form a reference signal sr2. The measuring circuit 220 may be coupled to the oscillator 260, for measuring a phase difference between the clocks CKref and CKv2 to form a distinction signal sd2. The sum block 230 may be coupled between the measuring circuit 220, the accumulator 210 and the loop filter 240, for forming a deviation signal se2 by a difference between the signals sr2 and sd2. The loop filter 240 may filter the signal se2 to form a filtered signal sf2. When the system 200 achieves stable phase lock, a frequency fv of the clock CKv2 may substantially equal a product of the frequency control word FCW and a frequency fr of the clock CKref, i.e., fv=FCW*fr. For example, the clock CKref may be in an order of MHz, and the clock CKv2 may be in an order of GHz. The loop filter 240 may be a low-pass filter.

The SIL controller 250 may have an input port i2 and an output port p2; the port i2 may be coupled to the sum block 230, and the port p2 may be coupled to the sum block 255. To improve mitigation of injection-pulling effect, the SIL controller 250 may form an auxiliary signal sa2 which tracks instantaneous varying of the signal se2. The sum block 255 may be coupled between the loop filter 240, the SIL controller 250 and the oscillator 260, for forming the signal sc2 by summing the signals sf2 and sa2. Because the signal sd2 is formed by the phase difference between the clocks CKv2 and CKref, instantaneous varying of the signal sd2 (and the signal se2 containing the signal sd2) may reflect instantaneous affection of injection-pulling effect on the clock CKv2.

The SIL controller 250 according to the invention will enable the signal sa2, and therefore the summed control signal sc2, to keep tracking instantaneous varying of the signal se2, so the oscillator 260 may promptly counteract immediate affection of injection-pulling effect under control of the summed control signal sc2, and mitigation of injection-pulling effect may thus be improved.

In an embodiment, the accumulator 210, the measuring circuit 220, the loop filter 240, the SIL controller 250 and the sum blocks 230 and 255 may be implemented by digital circuitry in a digital domain clocked by the clock CKref, and the oscillator 260 may be a digitally controlled oscillator. For example, the loop filter 240 may be a digital low-pass filter, and the measuring circuit 220 may be a TDC; at each cycle of the clock CKref, the measuring circuit 220 may convert a time difference between a significant edge (e.g., rising edge) of the clock CKv2 and a significant edge of the clock CKref to a digital value, so as to form a sample sd2[n] of the signal sd2. At an n-th cycle when the sample sd2[n] is measured and a sample se2[n] of the signal se2 is formed by the sum block 230, the SIL controller 250 will enable an immediate sample sa2[n] of the signal sa2 to track value of the sample se2[n], so an immediate sample sc2[n] of the summed control signal sc2 will reflect an instantaneous value of the sample se2[n]. It is noted that, because of digital filtering of the loop filter 240, an immediate sample sf2[n] of the filter signal sf2 at the n-th cycle will not reflect the instantaneous value of the sample se2[n]; the instantaneous value of the sample se2[n] will be reflected by subsequent sample sf2[n+1] or sf[n+2] of the signal sf2 at subsequent (n+1)-th or (n+2)-th cycle.

In an embodiment, the SIL controller 250 may adjust value of the sample sa2[n] according to latency of the measuring circuit 220 and the SIL controller 250, and may therefore cause the sample sa2[n] to be substantially 180-degree out of phase with the phase difference between the clocks CKref and CKv2, so the resultant summed control signal sc2 may enable the oscillator 260 to oscillate with a tendency opposite to affection of injection-pulling effect, e.g., to oscillate faster when injection-pulling effect causes the clock CKv2 to slow down. Because the measuring circuit 220 may be a digital circuit, latency of the measuring circuit 220 may be well estimated and compensated at design level.

Figure 6:
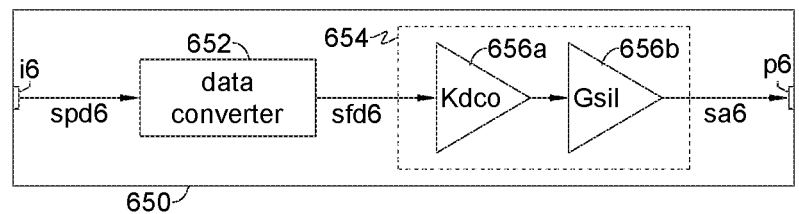
FIG. 6 illustrate a SIL controller according to an embodiment of the invention.

The SIL controller 250 may be implemented by a SIL controller 650 shown in FIG. 6. As shown in FIG. 6, the SIL controller 650 may have an input port i6 and an output port p6, and may include a data converter 652 and an internal amplifier 654 cascaded between the ports i6 and p6. The data converter 652 may receive a phase difference signal spd6 from the port i6, and convert the signal spd6 to a frequency difference signal sfd6. For example, the signals spd6 and sfd6 may be of different dynamic ranges, data formats, coding and/or units, and the data converter 652 may performing conversion between the different dynamic ranges, data formats, coding and/or units. In an embodiment, the oscillator 260 may be a digitally controlled oscillator accepting a digital control signal sc2 of a frequency controlling format; to implement the SIL controller 250 by the SIL controller 650 for such embodiment, the data converter 652 in the SIL controller 650 may convert the signal spd6 to a signal sfd6 of the frequency controlling format. In an embodiment, the oscillator 260 may be a voltage controlled oscillator accepting a voltage control signal sc2; to implement the SIL controller 250 by the SIL controller 650 for such embodiment, the data converter 652 in the SIL controller 650 may convert the signal spd6 to a voltage signal sfd6.

In the SIL controller 650, the amplifier 654 may amplify the signal sfd6 to form a signal sa6 at the port p6. The amplifier 654 may include a first amplifier 656a for amplifying by an oscillator tuning sensitivity Kdco, and a second amplifier unit 656b for amplifying by a SIL loop gain Gsil, wherein the oscillator tuning sensitivity Kdco may be a constant related to the oscillator, and the SIL loop gain Gsil may be programmable (variable) for flexibility. To implement the SIL controller 250 in FIG. 2 by the SIL controller 650 in FIG. 6, the ports i2 and p2 may be respectively implemented by the ports i6 and p6, so the signal se2 (FIG. 2) at the port i2 may be received as the signal spd6 (FIG. 6) at the port i6, and the signal sa6 at the port p6 may be outputted as the signal sa2 (FIG. 2) at the port p2.

Figure 3:
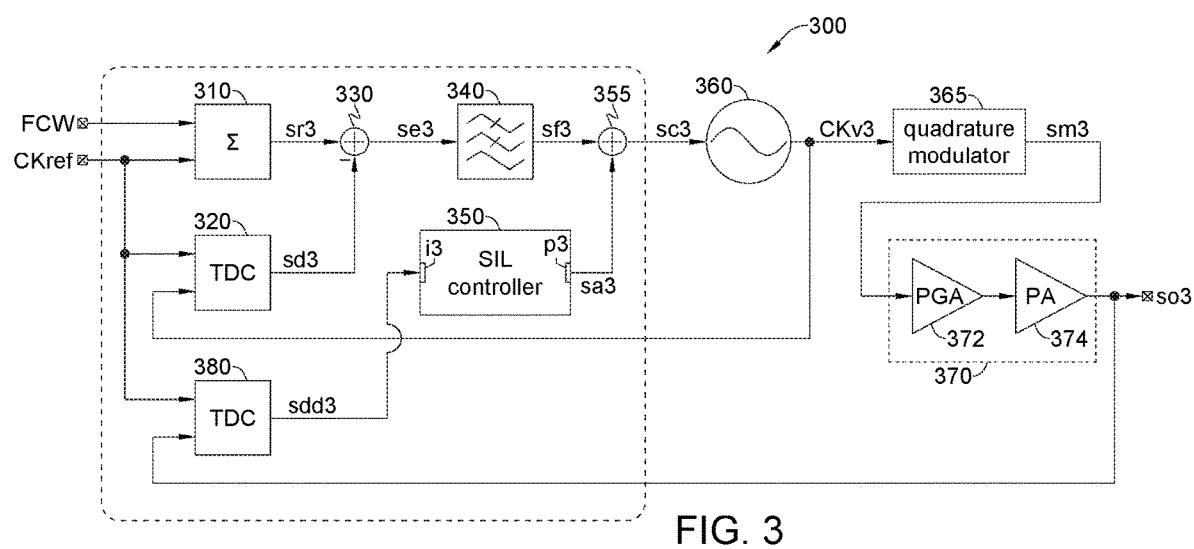

Please refer to FIG. 3 illustrating a signal system 300 according to an embodiment of the invention. The system 300 may include an accumulator 310, a measuring circuit 320, a sum block 330, a loop filter 340, an oscillator 360, a quadrature modulator 365 and a main amplifier 370; to improve mitigation of injection-pulling effect, the system 300 may further include a SIL controller 350 and a measuring circuit 380 along with another sum block 355. The oscillator 360 may generate an output clock CKv3 under control of a control signal sc3. The quadrature modulator 365 may be coupled to the oscillator 360, for performing a quadrature modulation by the output clock CKv3 to form a modulated signal sm3. The main amplifier 370 may be coupled to the quadrature modulator 365, for amplifying the modulated signal sm3 to form an output signal so3. The main amplifier 370 may include a programmable-gain amplifier 372 and a power amplifier 374.

The accumulator 310 may be coupled to a frequency command word FCW and a reference clock CKref, for accumulating the frequency command word FCW at each cycle of the clock CKref to form a reference signal sr3. The measuring circuit 320 may be coupled to the oscillator 360, for measuring a phase difference between the clocks CKref and CKv3 to form a distinction signal sd3. The sum block 330 may be coupled between the measuring circuit 320, the accumulator 310 and the loop filter 340, for forming a deviation signal se3 by a difference between the signals sr3 and sd3. The loop filter 340 may filter the signal se3 to form a filtered signal sf3. The measuring circuit 380 may be coupled between the main amplifier 370 and the SIL controller 350, for measuring a phase difference between the clock CKref and the signal so3 to form a second distinction signal sdd3.

The SIL controller 350 may have an input port i3 and an output port p3 respectively coupled to the measuring circuit 380 and the sum block 355. To improve mitigation of injection-pulling effect, the SIL controller 350 may form an auxiliary signal sa3 which tracks instantaneous varying of the signal sdd3. The sum block 355 may be coupled between the loop filter 340, the SIL controller 350 and the oscillator 360, for forming the signal sc3 by summing the signals sf3 and sa3. Because the signal sdd3 is formed by the phase difference between the clock CKref and the signal so3, instantaneous varying of the signal sdd3 (and the signal sa3) may reflect instantaneous affection of injection-pulling effect on the signal so3. The SIL controller 350 will cause the signal sa3, and therefore the summed control signal sc3, to keep tracking instantaneous varying of the signal sdd3, so the oscillator 360 may promptly counteract immediate affection of injection-pulling effect under control of the summed signal sc3, and mitigation of injection-pulling effect may thus be improved.

In an embodiment, the accumulator 310, the measuring circuits 320 and 380, the loop filter 340, the SIL controller 350 and the sum blocks 330 and 355 may be implemented by digital circuitry operating in a digital domain clocked by the clock CKref, and the oscillator 360 may be a digitally controlled oscillator. For example, each of the measuring circuits 320 and 380 may be a TDC; at each cycle of the clock CKref, the measuring circuit 320 may convert a time difference between a significant edge of the clock CKv3 and a significant edge of the clock CKref to a digital value, so as to form a sample sd3[n] of the signal sd3; on the other hand, the measuring circuit 380 may convert a time difference between a significant edge of the signal so3 and a significant edge of the clock CKref to a digital value, so as to form a sample sdd3[n] of the signal sdd3.

At an n-th cycle when the samples sd3[n] and sdd3[n] are measured and a sample se3[n] of the signal se3 is formed by the sum block 330, the SIL controller 350 may enable an immediate sample sa3[n] of the signal sa3 to track value of the sample sdd3[n], so an immediate sample sc3[n] of the summed control signal sc3 will reflect an instantaneous value of the sample sdd3[n]. In an embodiment, the SIL controller 350 may cause the sample sa3[n] to be substantially 180-degree out of phase with the phase difference between the clock CKref and the signal so3, so the resultant summed control signal sc3 may enable the oscillator 360 to counteract affection of injection-pulling effect.

Similar to the SIL controller 250 in FIG. 2, the SIL controller 350 in FIG. 3 may be implemented by the SIL controller 650 shown in FIG. 6 with the ports i3 and p3 respectively implemented by the ports i6 and p6, so the signal sdd3 (FIG. 3) at the port i3 may be received as the signal spd6 (FIG. 6) at the port i6, and the signal sa6 at the port p6 may be outputted as the signal sa3 (FIG. 3) at the port p3.

The system 200 or 300 in FIG. 2 or 3 may be applied to various kinds of transmitter implementation. For example, by setting the frequency control word FCW to vary based on a baseband signal (not shown), the system 200 or 300 may implement as DFM (direct frequency modulation) or direct conversion transmitter with improved mitigation of injection-pulling effect. Furthermore, the invention may be applied to signal systems of other modulation, such as polar modulation. Please refer to FIG. 4 illustrating a signal system 400 according to an embodiment of the invention.

Figure 4:
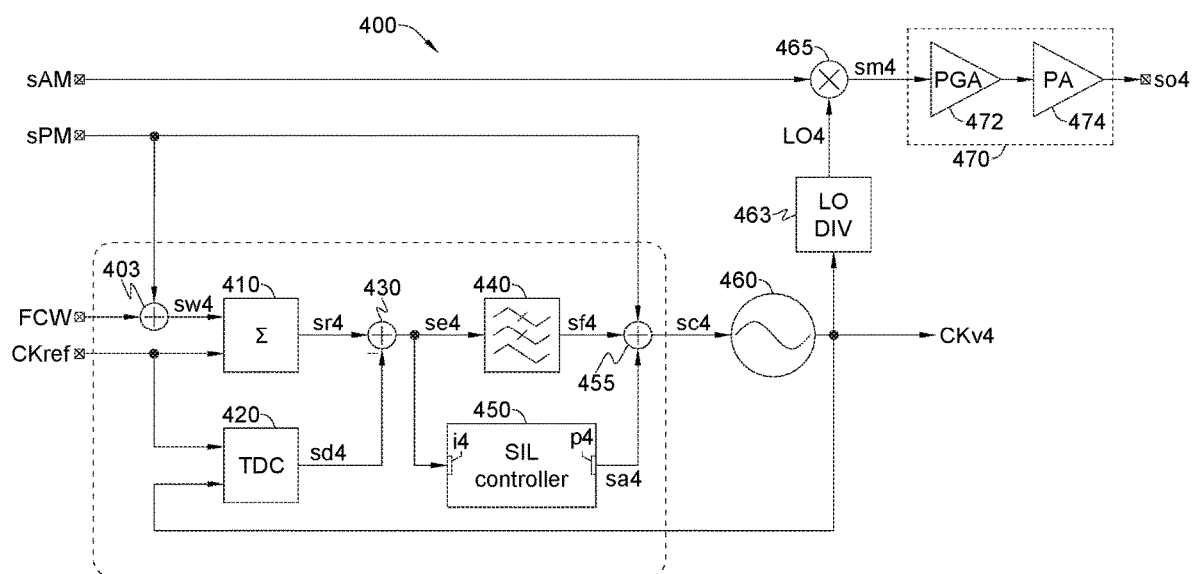

As shown in FIG. 4, the system 400 may include an accumulator 410, a measuring circuit 420, sum blocks 403 and 430, a loop filter 440, an oscillator 460, a frequency divider 463, a mixer 465 and a main amplifier 470; to improve mitigation of injection-pulling effect, the system 400 may further include a SIL controller 450 along with a sum block 455. The oscillator 460 may generate an output clock CKv4 under control of a control signal sc4. The frequency divider 463 may be coupled to the oscillator 460, for performing frequency dividing on the clock CKv4 to form a local oscillation signal LO4. The mixer 465 may be coupled to a second source signal sAM and the frequency divider 463, for mixing the local oscillation signal LO4 and the source signal sAM to form a mixed signal sm4. The main amplifier 470 may be coupled to the mixer 465, for amplifying the mixed signal sm4 to form an output signal so4. The main amplifier 470 may include a programmable-gain amplifier 472 and a power amplifier 474.

The sum block 403 may sum a first source signal sPM and a frequency control word FCW to form a summed word sw4. The accumulator 410 may be coupled to the sum block 403 and a reference clock CKref, for accumulating the summed word sw4 at each cycle of the clock CKref to form a reference signal sr4. The measuring circuit 420 may be coupled to the oscillator 360, for measuring a phase difference between the clocks CKref and CKv4 to form a distinction signal sd4. The sum block 430 may be coupled between the measuring circuit 420, the accumulator 410 and the loop filter 440, for forming a deviation signal se4 by a difference between the signals sr4 and sd4. The loop filter 440 may filter the signal se4 to form a filtered signal sf4.

The SIL controller 450 may have an input port i4 and an output port p4 respectively coupled to the sum blocks 430 and 455. To improve mitigation of injection-pulling effect, the SIL controller 450 may form an auxiliary signal sa4 which tracks instantaneous varying of the signal se4. The sum block 455 may be coupled between the loop filter 440, the SIL controller 450 and the oscillator 460, for forming the signal sc4 by summing the signals sPM, sf4 and sa4. Because the signal sd4 is formed by the phase difference between the clocks CKref and CKv4, instantaneous varying of the signal sd4 (and the signal se4) may reflect instantaneous affection of injection-pulling effect on the clock CKv4. The SIL controller 450 will cause the signal sa4, and therefore the summed control signal sc4, to keep tracking instantaneous varying of the signal sd4, so the oscillator 460 may promptly counteract immediate affection of injection-pulling effect under control of the summed control signal sc4, and mitigation of injection-pulling effect may thus be improved.

In an embodiment, the accumulator 410, the measuring circuit 420, the loop filter 440, the SIL controller 450 and the sum blocks 403, 430 and 455 may be implemented by digital circuitry in a digital domain docked by the dock CKref, and the oscillator 460 may be a digitally controlled oscillator. For example, the measuring circuit 420 may be a TDC; at each cycle of the dock CKref, the measuring circuit 420 may convert a time difference between a significant edge of the clock CKv4 and a significant edge of the dock CKref to a digital value, so as to form a sample sd4[n] of the signal sd4.

At an n-th cycle when the sample sd4[n] is measured and a sample se4[n] of the signal se4 is formed by the sum block 430, the SIL controller 450 may cause an immediate sample sa4[n] of the signal sa4 to reflect value of the sample se4[n], so an immediate sample sc4[n] of the summed control signal sc4 will reflect an instantaneous value of the sample sd4[n]. In an embodiment, the SIL controller 450 may cause the sample sa4[n] to be substantially 180-degree out of phase with the phase difference between the clocks CKref and CKv4, so the resultant summed control signal sc4 may enable the oscillator 460 to counteract affection of injection-pulling effect.

Similar to the SIL controllers 250 and 350 in FIGS. 2 and 3, the SIL controller 450 in FIG. 4 may be implemented by the SIL controller 650 shown in FIG. 6, with the ports i4 and p4 respectively implemented by the ports i6 and p6, so the signal se4 (FIG. 4) at the port i4 may be received as the signal spd6 (FIG. 6) at the port i6, and the signal sa6 at the port p6 may be outputted as the signal sa4 (FIG. 4) at the port p4.

Figure 5:
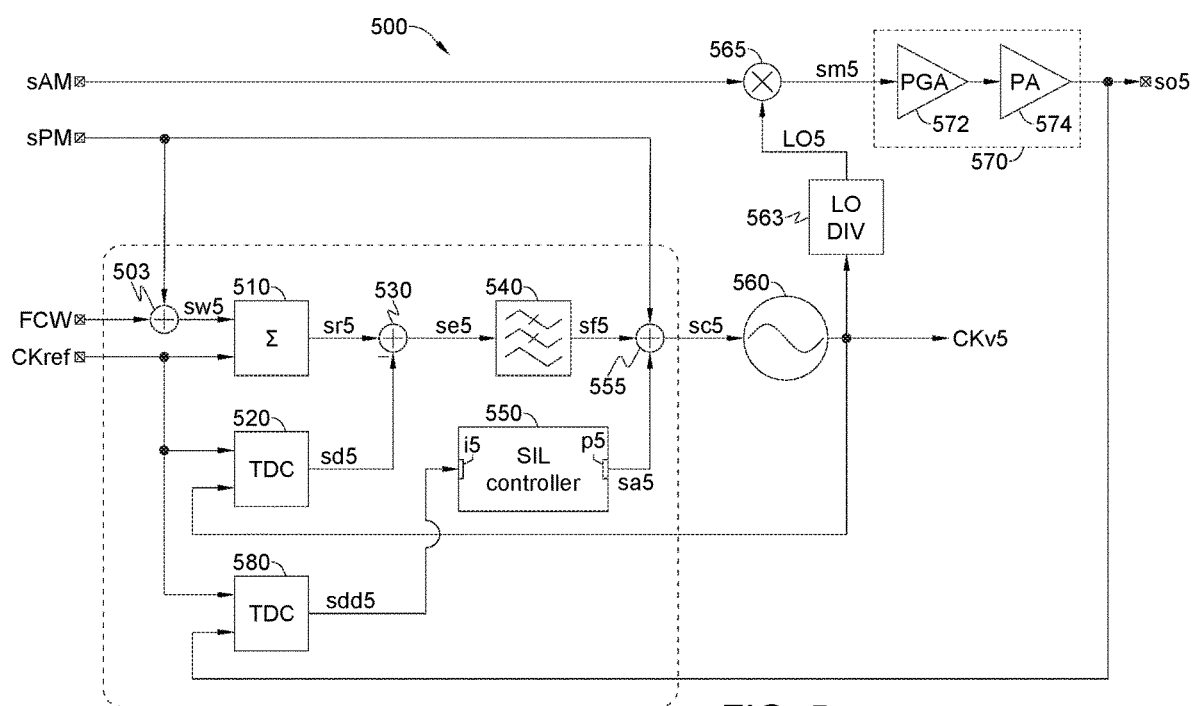

Please refer to FIG. 5 illustrating a signal system 500 according to an embodiment of the invention. The system 500 may include an accumulator 510, a measuring circuit 520, sum blocks 503 and 530, a loop filter 540, an oscillator 560, a frequency divider 563, a mixer 565 and a main amplifier 570; to improve mitigation of injection-pulling effect, the system 500 may further include a second measuring circuit 580 and a SIL controller 550 along with a sum block 555.

The oscillator 560 may generate an output dock CKv5 under control of a control signal sc5. The frequency divider 563 may be coupled to the oscillator 560, for performing frequency dividing on the clock CKv5 to form a local oscillation signal LO5. The mixer 565 may be coupled to a second source signal sAM and the frequency divider 563, for mixing the local oscillation signal LO5 and the source signal sAM to form a mixed signal sm5. The main amplifier 570 may be coupled to the mixer 565, for amplifying the mixed signal sm5 to form an output signal so5. The main amplifier 570 may include a programmable-gain amplifier 572 and a power amplifier 574.

The sum block 503 may sum a first source signal sPM and a frequency control word FCW to form a summed word sw5. The accumulator 510 may be coupled to the sum block 503 and a reference clock CKref, for accumulating the summed word sw5 at each cycle of the clock CKref to form a reference signal sr5. The measuring circuit 520 may be coupled to the oscillator 560, for measuring a phase difference between the clocks CKref and CKv5 to form a distinction signal sd5. The sum block 530 may be coupled between the measuring circuit 520, the accumulator 510 and the loop filter 540, for forming a deviation signal se5 by a difference between the signals sr5 and sd5. The loop filter 540 may filter the signal se5 to form a filtered signal sf5.

The measuring circuit 580 may be coupled between the main amplifier 570 and the SIL controller 550, for measuring a phase difference between the clock CKref and the output signal so5 to form a second deviation signal sdd5. The SIL controller 550 may have an input port i5 and an output port p5 respectively coupled to the measuring circuit 580 and the sum block 555. To improve mitigation of injection-pulling effect, the SIL controller 550 may form an auxiliary signal sa5 which tracks instantaneous varying of the signal sdd5. The sum block 555 may be coupled between the loop filter

540, the SIL controller 550 and the oscillator 560, for forming the signal sc5 by summing the signals sPM, sf5 and sa5. Because the signal sdd5 is formed by the phase difference between the clock CKref and the signal so5, instantaneous varying of the signal sdd5 may reflect instantaneous affection of injection-pulling effect on the signal so5. The SIL controller 550 will cause the signal sa5, and therefore the summed control signal sc5, to keep tracking instantaneous varying of the signal sdd5, so the oscillator 560 may promptly counteract immediate affection of injection-pulling effect under control of the summed control signal sc5, and mitigation of injection-pulling effect may thus be improved.

In an embodiment, the accumulator 510, the measuring circuits 520 and 580, the loop filter 540, the SIL controller 550 and the sum blocks 503, 530 and 555 may be implemented by digital circuitry in a digital domain clocked by the clock CKref, and the oscillator 560 may be a digitally controlled oscillator. For example, each of the measuring circuits 520 and 580 may be a TDC; at each cycle of the clock CKref, the measuring circuit 520 may convert a time difference between a significant edge of the clock CKv5 and a significant edge of the clock CKref to a digital value, so as to form a sample sd5[n] of the signal sd5; similarly, the measuring circuit 580 may convert a time difference between a significant edge of the clock CKv5 and a significant edge of the signal so5 to a digital value, so as to form a sample sdd5[n] of the signal sdd5.

At an n-th cycle when the samples sdd5[n] is measured and a sample se5[n] of the signal se5 is formed by the sum block 530, the SIL controller 550 may cause an immediate sample sa5[n] of the signal sa5 to track value of the sample sdd5[n], so an immediate sample sc5[n] of the summed control signal sc5 will reflect an instantaneous value of the sample sdd5[n]. In an embodiment, the SIL controller 550 may cause the sample sa5[n] to be substantially 180-degree out of phase with the phase difference between the clock CKref and the signal so5, so the resultant summed control signal sc5 may control the oscillator 560 to counteract affection of injection-pulling effect.

Similar to the SIL controllers 250, 350 and 450 in FIGS. 2, 3 and 4, the SIL controller 550 in FIG. 5 may be implemented by the SIL controller 650 shown in FIG. 6, with the ports i5 and p5 respectively implemented by the ports i6 and p6, so the signal sdd5 (FIG. 5) at the port i5 may be received as the signal spd6 (FIG. 6) at the port i6, and the signal sa6 at the port p6 may be outputted as the signal sa5 (FIG. 5) at the port p5.

Figure 7:
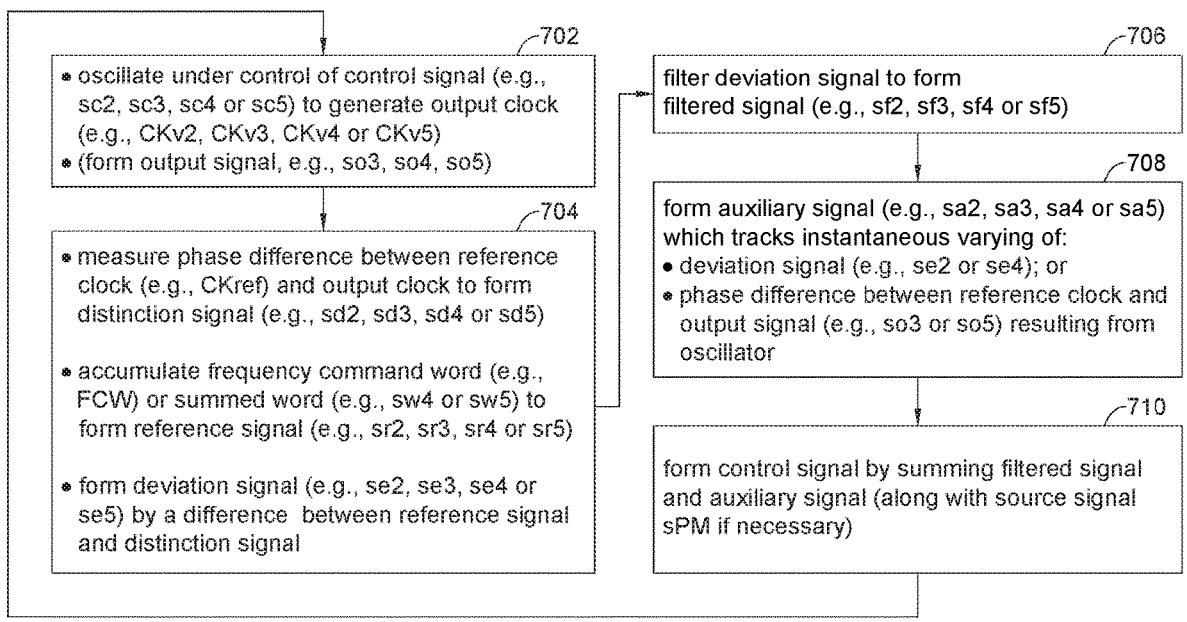
FIG. 7 illustrates operations of the systems shown in FIGS. 2 to 5.

Along with FIGS. 2 to 5, please refer to FIG. 7 illustrating operations of the systems 200, 300, 400 and 500, wherein major steps may be described as follows.

Step 702: in the system 200, 300, 400 or 500, the oscillator 260, 360, 460 or 560 may oscillate under control of a control signal sc2, sc3, sc4 or sc5 to generate an output clock CKv2, CKv3, CKv4 or CKv5. In the system 300, the quadrature modulator 365 may perform quadrature modulation by the output clock CKv3 to form a modulated signal sm3, and the main amplifier 370 may amplify the modulated signal sm3 to form the output signal so3. In the system 400 or 500, the frequency divider 463 or 563 may perform frequency dividing on the output clock CKv4 or CKv5 to form the local oscillation signal LO4 or LO5, the mixer 465 or 565 may mix the local oscillation signal and the source signal sAM to form the mixed signal sm4 or sm5, and the main amplifier 470 or 570 may amplify the mixed signal sm4 or sm5 to form the output signal so4 or so5.

Step 704: In the system 200, 300, 400 or 500, the measuring circuit 220, 320, 420 or 520 may measure phase difference between the reference clock CKref and the output clock (CKv2, CKv3, CKv4 or CKv5) to form the distinction signal sd2, sd3, sd4 or sd5. In the system 200 or 300, the accumulator 210 or 310 may accumulate the frequency command word FCW at each cycle of the reference clock CKref to form the reference signal sr2 or sr3. In the system 400 or 500, the sum block 403 or 503 may sum the frequency control word FCW and the source signal sPM to form the summed word sw4 or sw5, and the accumulator 410 or 510 may accumulate the summed word sw4 or sw5 at each cycle of the reference clock CKref to form the reference signal sr4 or sr5. In the system 200, 300, 400 or 500, the sum block 230, 330, 430 or 530 may form the deviation signal se2, se3, se4 or se5 by a difference between the reference signal (sr2, sr3, sr4 or sr5) and the distinction signal (sd2, sd3, sd4 or sd5).

Step 706: in the system 200, 300, 400 or 500, the loop filter 240, 340, 440 and 540 may filtering the deviation signal se2, se3, se4 or se5 to form the filtered signal sf2, sf3, sf4 or sf5.

Step 708: in the system 200 or 400, the SIL controller 250 or 450 may form the auxiliary signal sa2 or sa4 which tracks instantaneous varying of the deviation signal se2 or se4. In the system 300 or 500, the SIL controller 350 or 550 may form the auxiliary signal sa3 or sa5 which tracks instantaneous varying of a phase difference between the reference clock CKref and the output signal (so3 or so5). The SIL controller 250, 350, 450 or 550 in the systems 200, 300, 400 or 500 may be implemented by the SIL controller 650 in FIG. 6. In the system 200 or 400, the SIL controller 250 or 450 may convert the deviation signal se2 or se4 to the required auxiliary signal (e.g., sa2 or sa4) to correct the oscillator distortion due to injection-pulling effect. In the system 300 or 500, the SIL controller 350 or 550 may convert the signal sdd3 or sdd5, which is the phase difference between the reference clock CKref and the output signal (so3 or so5), to the required auxiliary signal (e.g., sa2 or sa4) to correct the oscillator distortion due to injection-pulling effect. The SIL controller 250, 350, 450 or 550 in FIG. 2, 3, 4 or 5 may be implemented by the SIL controller 650 in FIG. 6; the SIL controller 650 may achieve optimal self-injection condition by a data converter (e.g., 652 in FIG. 6) and an internal amplifier (e.g., 654 in FIG. 6).

Step 710: in the system 200 or 300, the sum block 255 or 355 may form the control signal sc2 or sc3 by summing the filtered signal (sf2 or sf3) and the auxiliary signal (sa2 or sa3). In the system 400 or 500, the sum block 455 or 555 may form the control signal sc4 or sc5 by summing the filtered signal (sf4 or sf5) and the auxiliary signal (sa4 or sa5) along with the source signal sPM.

Figure 8:
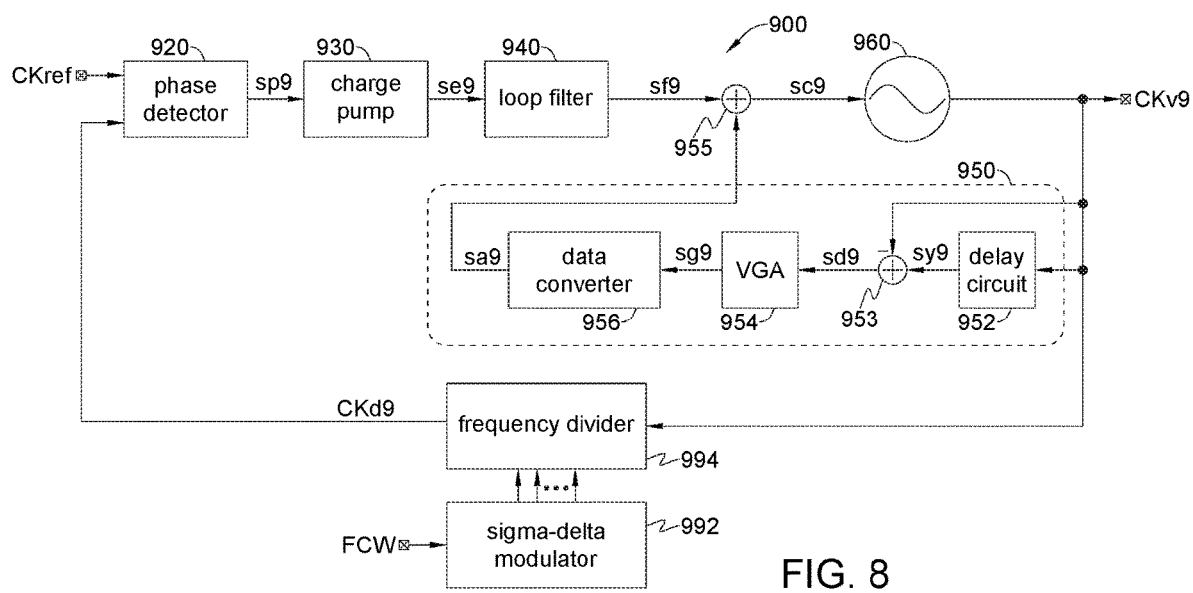
FIG. 8 illustrates a signal system according to an embodiment of the invention.

Please refer to FIG. 8 illustrating a signal system 900 according to an embodiment of the invention. The system 900 may include a phase detector 920, a charge pump 930, a loop filter 940, an oscillator 960a, a frequency divider 994 and a sigma-delta modulator 992; to improve mitigation of injection-pulling effect for the oscillator 960, the system 900 may further include a SIL controller 950 along with a sum block 955. The oscillator 960 may generate an output clock CKv9 under control of a control signal sc9. The sigma-delta modulator may modulate a frequency control word FCW, and the frequency divider 994 may be a multi-modulus divider coupled to the oscillator 960 and the sigma-delta modulator, for performing frequency dividing on the output clock CKv9 to form a divided clock CKd9 based on the modulated result of the sigma-delta modulator 992.

The phase detector 920 may be coupled to the frequency divider 994, for measuring a phase difference between a reference clock CKref and the divided clock CKd9 to form a preliminary deviation signal sp9. The charge pump 930 may be coupled between the phase detector 920 and the loop filter 940, for converting the preliminary deviation signal sp9 to a deviation signal se9 by current to voltage conversion. The loop filter 940 may be a low-pass filter coupled between the charge pump 930 and the sum block 955, for filtering the deviation signal se9 to form a filtered signal sf9. To improve mitigation of injection-pulling effect, the SIL controller 950 may be coupled between the oscillator 960 and the sum block 955, for forming an auxiliary signal sa9 by performing frequency discriminating on the output clock CKv9. The sum block 955 may be coupled between the oscillator 960, the SIL controller 950 and the loop filter 940, for forming the control signal sc9 by summing the filtered signal sf9 and the auxiliary signal sa9.

As shown in FIG. 8, the SIL controller 950 may include a delay circuit 952, an internal sum block 953, an internal amplifier 954 and a data converter 956. The delay circuit 952 may be coupled to the oscillator 960, for forming a delayed dock sy9 by delaying the output clock CKv9. The internal sum block 953 may be coupled between the oscillator 960, the delay circuit 952 and the internal amplifier 954, for forming a distinction signal sd9 by a difference between the output dock CKv9 and the delayed clock sy9. The internal amplifier 954 may be coupled between the internal sum block 953 and the data converter 956, for amplifying the distinction signal sd9 to form an amplified distinction signal sg9. The data converter 956 may be coupled between the sum block 955 and the internal amplifier 954, for converting the amplified distinction signal sg9 to a frequency difference as the auxiliary signal sa9.

To sum up, while an oscillator oscillates under control of a control signal to generate an output dock, the invention may cause the control signal to reflect immediate variation of the output clock or an output signal resulting from the output clock, because the invention may form the control signal not only by a filtered signal of loop filter, but also by an auxiliary signal which may track instantaneous varying of {i} a deviation signal which contains a phase difference between a reference clock and the output clock, {ii} a phase difference between the reference clock and the output signal, or {iii} a result of performing frequency discriminating on the output clock. The oscillator may therefore promptly counteract affection of injection-pulling effect, so as to improve mitigation of injection-pulling effect. The invention may be broadly applied to signal system with all-digital phase-locked loop (e.g., FIGS. 2 to 5), or signal system with analog phase-locked loop (e.g., FIG. 8). The invention may be exploited to implement RF or wireless transmitter or transceiver, or any other signal system demanding superior mitigation of injection-pulling effect.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method improving mitigation of injection-pulling effect for an oscillator; the oscillator generating an output clock under control of a control signal, and the method comprising:
   by a loop filter, filtering a deviation signal to form a filtered signal;
   by a SIL (self-injection locked) controller, forming an auxiliary signal which tracks the deviation signal or a phase difference between a reference clock and an output signal resulting from the output clock; and
   forming the control signal by combining the filtered signal and the auxiliary signal;
   wherein forming the auxiliary signal comprises:
      converting the deviation signal or said phase difference between the reference clock and the output signal to a frequency difference; and
      amplifying the frequency difference.

2. A method improving mitigation of injection-pulling effect for an oscillator; the oscillator generating an output clock under control of a control signal, and the method comprising:
   by a loop filter, filtering a deviation signal to form a filtered signal;
   by a SIL controller, forming an auxiliary signal which tracks the deviation signal or a phase difference between a reference clock and an output signal resulting from the output clock;
   forming the control signal by combining the filtered signal and the auxiliary signal;
   measuring a phase difference between the reference clock and the output clock to form a distinction signal;
   accumulating a frequency command word at each cycle of the reference clock to form a reference signal; and
   forming the deviation signal by a difference between the reference signal and the distinction signal.

3. The method of claim 2 further comprising:
   performing a quadrature modulation by the output clock to form a modulated signal; and
   amplifying the modulated signal to form the output signal.

4. A method improving mitigation of injection-pulling effect for an oscillator; the oscillator generating an output clock under control of a control signal, and the method comprising:
   by a loop filter, filtering a deviation signal to form a filtered signal;
   by a SIL controller, forming an auxiliary signal which tracks the deviation signal or a phase difference between a reference clock and an output signal resulting from the output clock;
   forming the control signal by combining the filtered signal, the auxiliary signal and a first source signal;
   measuring a phase difference between the reference clock and the output clock to form a distinction signal;
   combining a frequency control word and the first source signal to form a summed word;
   accumulating the summed word at each cycle of the reference clock to form a reference signal; and
   forming the deviation signal by a difference between the reference signal and the distinction signal.

5. The method of claim 4 further comprising:
   performing frequency dividing on the output clock to form a local oscillation signal;
   mixing the local oscillation signal and a second source signal to form a mixed signal; and
   amplifying the mixed signal to form the output signal.

6. A signal system improving mitigation of injection-pulling effect, comprising:
- an oscillator for generating an output clock under control of a control signal;
- a loop filter for filtering a deviation signal to form a filtered signal;
- a SIL controller for forming an auxiliary signal which tracks the deviation signal or a phase difference between a reference clock and an output signal resulting from the output clock; and
- a sum block coupled between the loop filter, the SIL controller and the oscillator, for forming the control signal by combining the filtered signal and the auxiliary signal;
- wherein the SIL controller comprises:
- a data converter for converting the deviation signal or said phase difference between the reference clock and the output signal to a frequency difference signal; and
- an internal amplifier for amplifying the frequency difference signal.

7. A signal system improving mitigation of injection-pulling effect, comprising:
- an oscillator for generating an output clock under control of a control signal;
- a loop filter for filtering a deviation signal to form a filtered signal;
- a SIL controller for forming an auxiliary signal which tracks the deviation signal or a phase difference between a reference clock and an output signal resulting from the output clock;
- a sum block coupled between the loop filter, the SIL controller and the oscillator, for forming the control signal by combining the filtered signal and the auxiliary signal;
- a measuring circuit coupled to the oscillator, for measuring a phase difference between the reference clock and the output clock to form a distinction signal;
- an accumulator for accumulating a frequency command word at each cycle of the reference clock to form a reference signal; and
- a second sum block coupled between the measuring circuit, the accumulator and the loop filter, for forming the deviation signal by a difference between the reference signal and the distinction signal.

8. The signal system of claim 7 further comprising:
- a quadrature modulator coupled to the oscillator, for performing a quadrature modulation by the output clock to form a modulated signal; and
- a main amplifier coupled to the quadrature modulator, for amplifying the modulated signal to form the output signal.

9. The signal system of claim 8 further comprising:
- a second measuring circuit coupled between the main amplifier and the SIL controller, for measuring said phase difference between the reference clock and the output signal.

10. The signal system of claim 8, wherein the main amplifier comprises a power amplifier and a programmable-gain amplifier.

11. The signal system of claim 7, wherein the measuring circuit is a TDC (time-to-digital converter).

12. A signal system improving mitigation of injection-pulling effect, comprising:
- an oscillator for generating an output clock under control of a control signal;
- a loop filter for filtering a deviation signal to form a filtered signal;
- a SIL controller for forming an auxiliary signal which tracks the deviation signal or a phase difference between a reference clock and an output signal resulting from the output clock;
- a sum block coupled between the loop filter, the SIL controller and the oscillator, for forming the control signal by combining the filtered signal, the auxiliary signal and a first source signal;
- a measuring circuit coupled to the oscillator, for measuring a phase difference between the reference clock and the output clock to form a distinction signal;
- an accumulator for accumulating a summed word at each cycle of the reference clock to form a reference signal;
- a second sum block coupled between the measuring circuit, the accumulator and the loop filter, for forming the deviation signal by a difference between the reference signal and the distinction signal; and
- a third sum block coupled to the accumulator, for combining a frequency control word and the first source signal to form the summed word.

13. The signal system of claim 12 further comprising:
- a frequency divider coupled to the oscillator, for performing frequency dividing on the output clock to form a local oscillation signal;
- a mixer coupled to the frequency divider, for mixing the local oscillation signal and a second source signal to form a mixed signal; and
- a main amplifier coupled to the mixer, for amplifying the mixed signal to form the output signal.

14. The signal system of claim 13 further comprising:
- a second measuring circuit coupled between the main amplifier and the SIL controller, for measuring said phase difference between the reference clock and the output signal.

15. The signal system of claim 6, wherein the oscillator is a digitally controlled oscillator.

16. A signal system improving mitigation of injection-pulling effect, comprising:
- an oscillator for generating an output clock under control of a control signal;
- a loop filter for filtering a deviation signal to form a filtered signal; and
- a SIL controller for forming an auxiliary signal by performing frequency discriminating on the output clock; and
- a sum block coupled between the oscillator, the SIL controller and the loop filter, for forming the control signal by combining the filtered signal and the auxiliary signal;
- wherein the SIL controller comprises:
- a delay circuit coupled to the oscillator, for forming a delayed clock by delaying the output clock;
- an internal sum block coupled to the delay circuit, for forming a distinction signal by a difference between the output clock and the delayed clock;
- an internal amplifier coupled to the internal sum block, for amplifying the distinction signal to form an amplified distinction signal; and
- a data converter for converting the amplified distinction signal to a frequency difference as the auxiliary signal.

17. The signal system of claim 16 further comprising:
- a frequency divider coupled to the oscillator, for performing frequency dividing on the output clock to form a divided clock;

a phase detector coupled to the frequency divider, for measuring a phase difference between a reference clock and the divided clock to form a preliminary deviation signal; and a charge pump coupled between the phase detector and the loop filter, for converting the preliminary deviation signal to the deviation signal by current to voltage conversion.

18. A method improving mitigation of injection-pulling effect for an oscillator; the oscillator generating an output clock under control of a control signal, and the method comprising:

by a loop filter, filtering a deviation signal to form a filtered signal;

by a SIL controller, receiving an internal signal and forming an auxiliary signal by arranging each sample of the auxiliary signal to track each corresponding sample of the internal signal without delay; wherein:

the internal signal is the deviation signal or a phase difference between a reference clock and an output signal resulting from the output clock; and the control signal results from a combination of the filtered signal and the auxiliary signal.

19. A signal system improving mitigation of injection-pulling effect, comprising:

an oscillator for generating an output clock under control of a control signal;

a loop filter for filtering a deviation signal to form a filtered signal;

a SIL controller receiving an internal signal and forming an auxiliary signal by arranging each sample of the auxiliary signal to track each corresponding sample of the internal signal without delay; wherein the internal signal is the deviation signal or a phase difference between a reference clock and an output signal resulting from the output clock; and a sum block coupled between the loop filter, the SIL controller and the oscillator, for forming the control signal according to a combination of the filtered signal and the auxiliary signal.

* * * * *